United States Patent [19]
Chung

[11] Patent Number: 6,085,925
[45] Date of Patent: Jul. 11, 2000

[54] HOUSING FOR NETWORK PRODUCTS

[75] Inventor: Ming-Tsai Chung, Hsinchu, Taiwan

[73] Assignee: D-Link Corporation, Hsinchu, Taiwan

[21] Appl. No.: 09/350,112

[22] Filed: Jul. 9, 1999

[51] Int. Cl.[7] .................................................. H05K 5/02
[52] U.S. Cl. ...................... 220/4.02; 220/23.6; 206/511; 361/732; 361/735
[58] Field of Search .................................. 220/23.6, 4.02; 206/504, 509, 511, 512; 361/735, 732

[56] References Cited

U.S. PATENT DOCUMENTS

| | | | |
|---|---|---|---|
| 4,545,487 | 10/1985 | Asmus | 220/23.6 |
| 4,813,542 | 3/1989 | Thompson et al. | 206/504 |
| 5,617,953 | 4/1997 | Cope | 220/23.86 |
| 5,864,467 | 1/1999 | Recchia et al. | 220/23.6 |
| 5,949,653 | 9/1999 | Weng | 220/23.6 |

*Primary Examiner*—Joseph M. Moy
*Attorney, Agent, or Firm*—Bacon & Thomas, PLLC

[57] ABSTRACT

The housing for network products comprises at least one slot provided on a first surface and a transparent panel provided on a second surface; a raised portion provided on a third surface adjacent to the second surface, including a first fingernail shaped recessed portion having a first slot provided thereon; a wave shaped recessed portion, provided on the third surface adjacent to the first surface, having a plurality of spaced apart first recessed portions provided along an edge of the elongated recessed portion opposite to the first surface, and a plurality of passages, each having at least one through hole, provided along the edge corresponding to each of the first recessed portions; a first fingernail shaped raised portion corresponding to the first fingernail shaped recessed portion having a first riser provided on a fourth surface adjacent to the second surface; and a plurality of second fingernail shaped raised portions provided on the fourth surface. By utilizing this construction, space saving when a plurality of housings stacked as well as easier inspection and management are realized.

12 Claims, 5 Drawing Sheets

HOUSING FOR NETWORK PRODUCTS

FIELD OF THE INVENTION

The present invention relates to a housing, and more particularly to a housing for network products which can be stacked on another housing with similar construction.

BACKGROUND OF THE INVENTION

Typically, a number of network products, such as hub, switch, modem, printer server, gateway, ISDN, and so on, each has a predetermined shape. As such, a large space will be occupied by the network products if there are stacked, resulting in the interference with storage, and detracting from their external appearance. To the worse, inspection and management of these network products will be difficult to carry out.

Thus, it is desirable to provide a housing for network products to overcome the above deficiencies.

SUMMARY OF THE INVENTION

It is an object of the present invention to provide a housing for network products which can be stacked on another housing with similar construction. Further, the stacked housings are secured by means of inserting a number of raised portions and recessed portions of one housing into the corresponding recessed portions and raised portions of the other housing. By utilizing this construction, a number of advantages are realized, such as space saving, appearance preserved, and easier inspection and management of the network products.

The above and other objects, features and advantages of the present invention will become apparent from the following detailed description taken with the accompanying drawings.

DETAILED DESCRIPTION OF THE PREFERRED EMBODIMENTS

Figure 1:
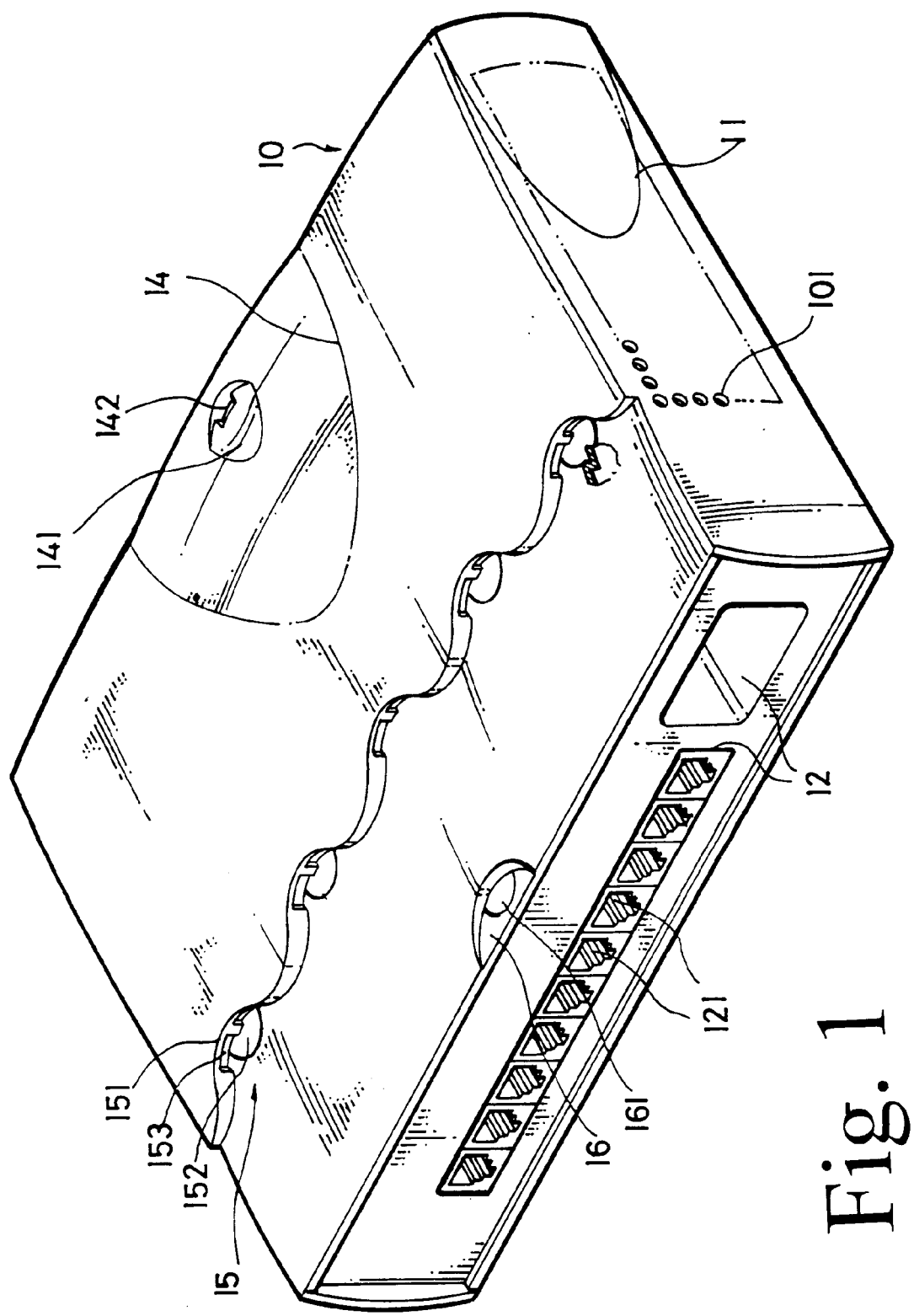
FIG. 1 is a perspective view of a first embodiment of a housing constructed in accordance with the present invention.
Figure 2:
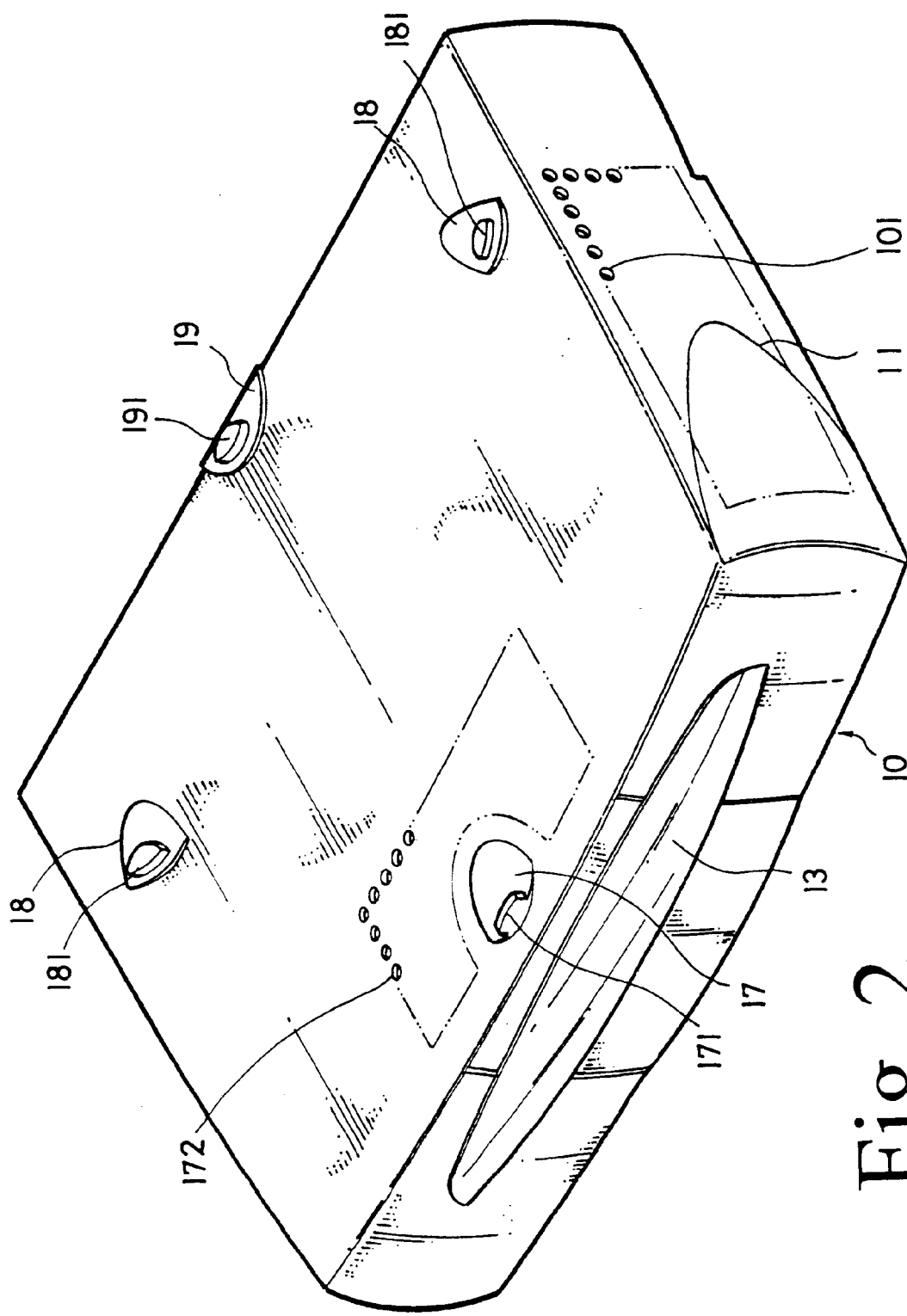
FIG. 2 is another perspective view of FIG. 1.

Referring to FIGS. 1–2, there is shown a first embodiment of a housing 10. The housing 10 has a substantially rectangular surface. A raised portion 11 is provided on a side surface of the housing 10, while another raised portion 11 is provided on an opposite side surface of the housing 10. A plurality of first holes 101, provided on a periphery of each of the raised portions 11, function for ventilating heat generated by the electronic devices (not shown) within the housing 10 in operation.

A number of slots 12 are provided on a front surface of the housing 10 for accommodating a plurality of connection ports 121 therein, while a transparent panel 13 is provided on a rear surface of the housing 11. A raised portion 14 is provided on a top surface of the housing 10. One side of the raised portion 14 is located on a junction of the top surface of the housing 10 and the rear surface (i.e., the surface provided with the transparent panel 13). A first fingernail shaped recessed portion 141 is provided on the raised portion 14. A first slot 142 is further provided on the recessed portion 141. A wave shaped recessed portion 15 is provided on the top surface of the housing 10. The wave shaped recessed portion 15 is adjacent to and by a predetermined distance separated from the front surface (i.e., the surface provided with the connection ports 121). The wave shaped recessed portion 15 has a number of valley portions 151. A number of first recessed portions 152 are provided on the top surface of the housing 10. Each of first recessed portions 152 is adjacent to the corresponding valley portion 151. A number of through holes 153, provided on each of the valley portions 151, function for ventilating heat generated by the electronic devices (not shown) within the housing 10 in operation.

A second fingernail shaped recessed portion 16 is provided on the top surface of the housing 10. One side of the recessed portion 16 is located on a junction of the top surface and the front surface of the housing 10, i,e., the recessed portion 16 is located between the wave shaped recessed portion 15 and the front surface provided with the connection ports 121. A second recessed portion 161 is provided on the recessed portion 16.

A first fingernail shaped raised portion 17 corresponding to the first fingernail shaped recessed portion 141 is provided on a bottom surface of the housing 10. The raised portion 17 is adjacent to and by a predetermined distance separated from the transparent panel 13. A first riser 171 is provided on the raised portion 17. The riser 171 is able to be inserted into the first slot 142. A plurality of second holes 172, provided on the periphery of the raised portion 17, function for ventilating heat generated by the electronic devices (not shown) within the housing 10 in operation.

Further, a pair of second fingernail shaped raised portions 18, separated by a predetermined distance, are provided on the bottom surface of the housing 10. A second riser 181, provided on the raised portion 18, is able to be inserted into the first recessed portion 152 of the wave shaped recessed portion 15. Furthermore, a third fingernail shaped raised portion 19 is provided the bottom surface of the housing 10. One side of the raised portion 19 is on a junction of the bottom surface of the housing 10 and the front surface (i.e., the surface provided with the connection ports 121). A third riser 191, provided on the raised portion 19, is able to be inserted into the second recessed portion 161.

Figure 3:
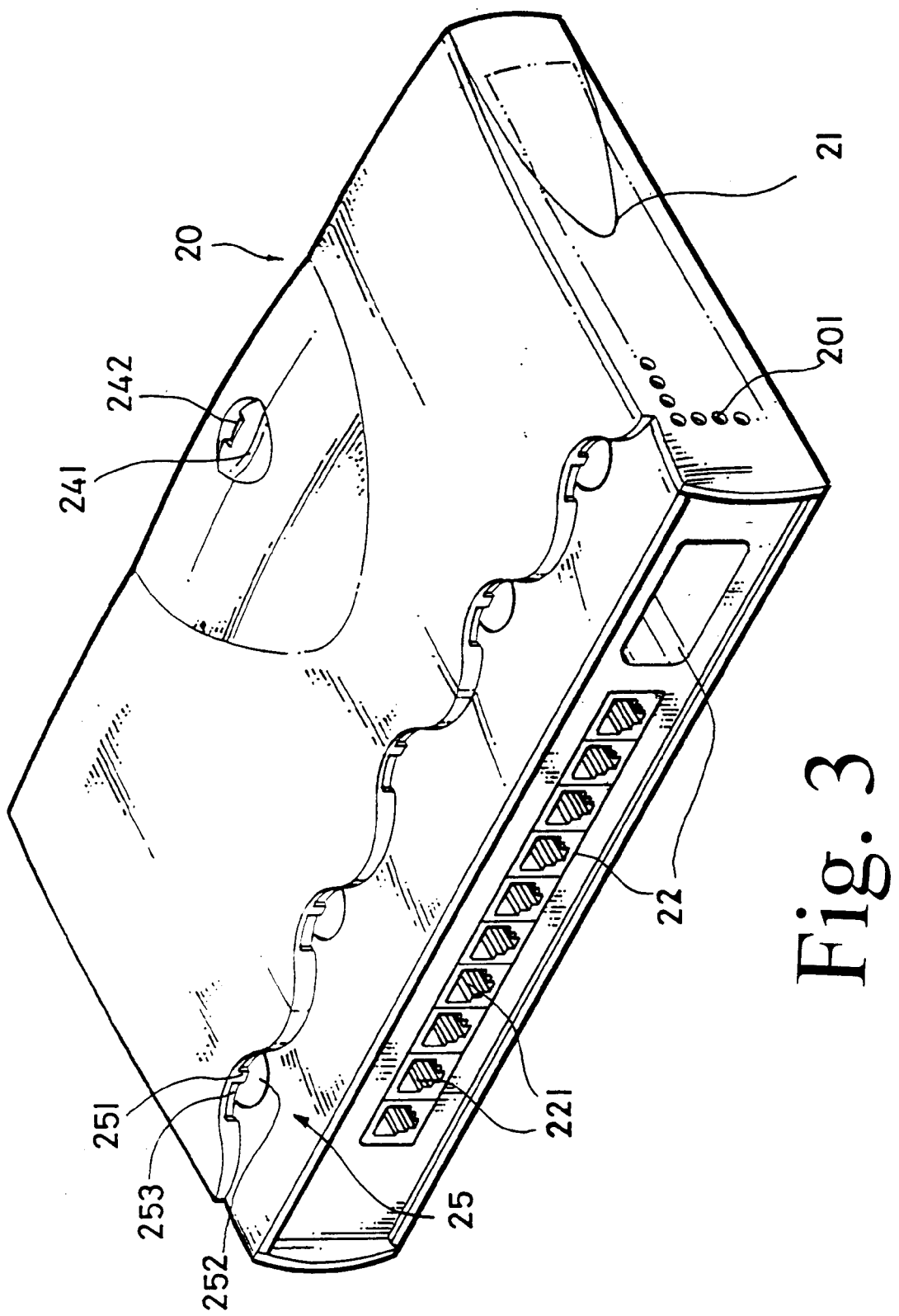
FIG. 3 is a perspective view of a second embodiment of a housing constructed in accordance with the present invention.
Figure 4:
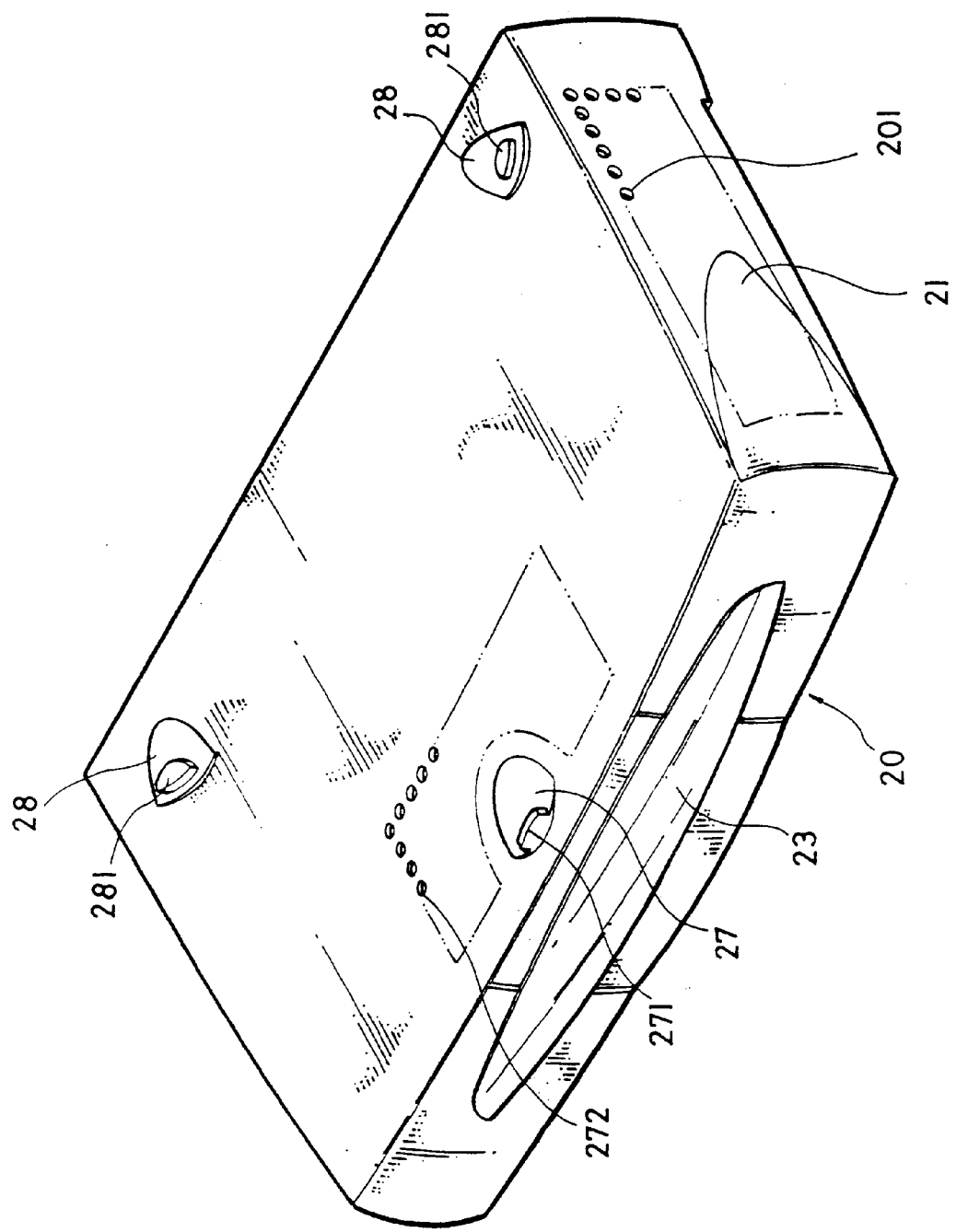
FIG. 4 is another perspective view of FIG. 3.

Referring to FIGS. 3–4, there is shown a second embodiment of the housing 20. The difference between the construction of the housing 10 and the housing 20 is that the housing 20 does not have the second fingernail shaped recessed portion and the third fingernail shaped raised portion. Thus, no further detail description regarding the same is necessary for a full understanding of the invention.

Figure 5:
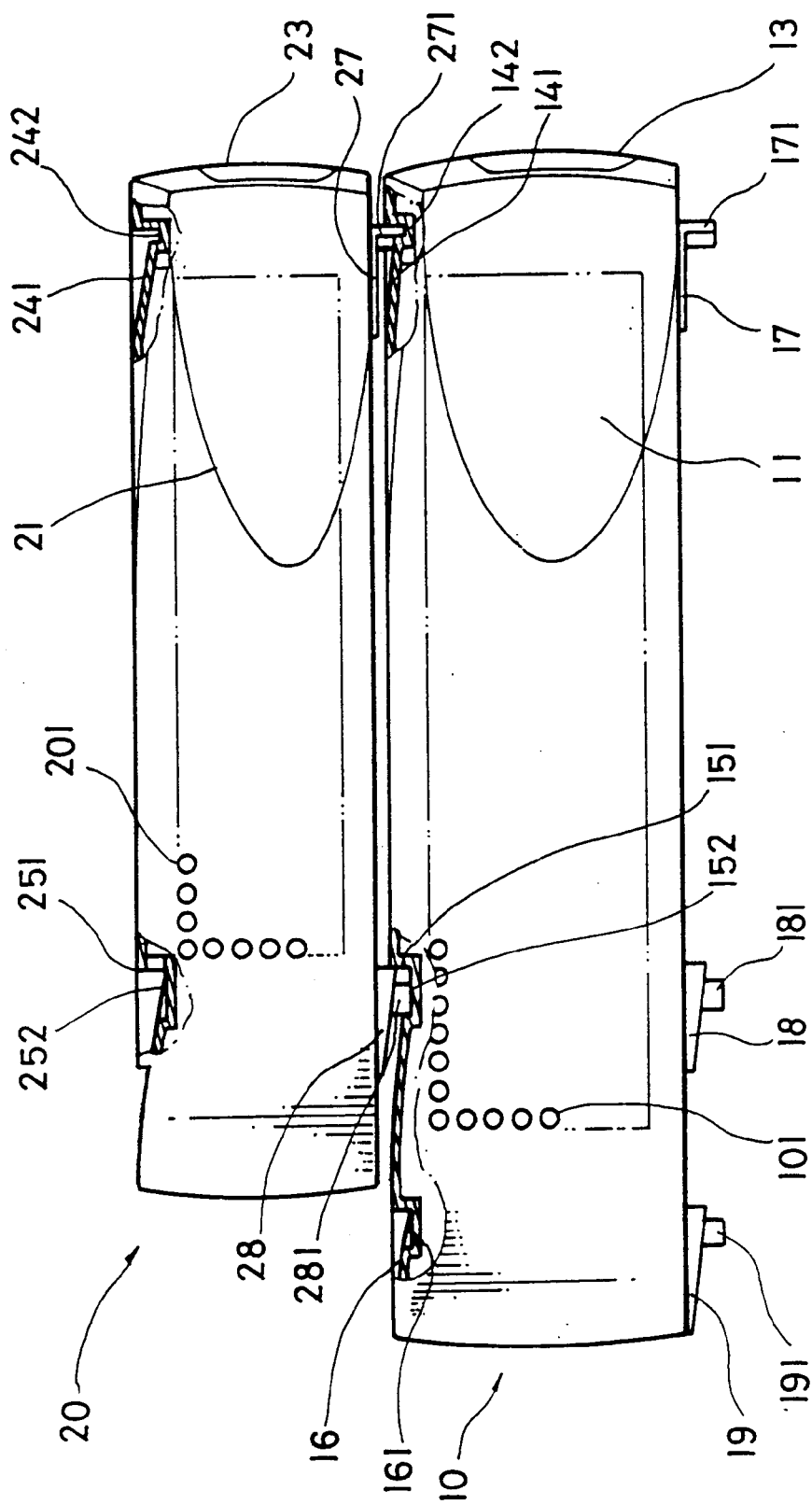
FIG. 5 is a cross-sectional view of an embodiment of the present invention.

In FIG. 5, the housing 10 is stacked on the housing 20 wherein a first fingernail shaped raised portion 27 and a first riser 271, and a pair of a second fingernail shaped raised portions 28 and a second risers 281 are inserted into the first fingernail shaped recessed portion 141 and the first slot 142, and the pair of valley portions 151 and the first recessed portions 152 respectively. As a result, the stacked housings 10 and 20 are secured.

It is also possible to correspondingly stack one housing 10 on the other housing 10 and one housing 20 on the other housing 20 which is apparent to one of ordinary skill in the art.

While the invention herein disclosed has been described by means of specific embodiments, numerous modifications and variations could be made thereto by those skilled in the art without departing from the scope of the invention set forth in the claims.

What is claimed is:

1. A housing for network products having a first surface, an opposite second surface, a third surface, an opposite fourth surface, a fifth surface, and an opposite sixth surface, the housing comprising:

at least one slot provided on the first surface and a transparent panel provided on the second surface;

a raised portion, provided on the third surface adjacent to the second surface, including a first fingernail shaped recessed portion having a first slot provided thereon;

an elongated recessed portion, provided on the third surface adjacent to and by a predetermined distance separated from the first surface, having a plurality of spaced apart first recessed portions provided along an edge of the elongated recessed portion opposite to the first surface, and a plurality of passages, each having at least one through hole, provided along the edge corresponding to each of the first recessed portions;

a first fingernail shaped raised portion corresponding to the first fingernail shaped recessed portion having a first riser provided on the fourth surface adjacent to and by a predetermined distance separated from the second surface; and a plurality of second fingernail shaped raised portions each having a second riser, provided on the fourth surface.

2. The housing of claim 1, further comprising a first raised portion provided on the fifth surface and a second raised portion provided on the sixth surface.

3. The housing of claim 2, further comprising a plurality of first holes provided on a periphery of the first raised portion and the second raised portion respectively.

4. The housing of claim 1, further comprising a plurality of connection ports provided in the first surface.

5. The housing of claim 1, wherein the edge of the elongated recessed portion has a wave shape.

6. The housing of claim 5, wherein each of the first recessed portions is formed on a valley of edge of the elongated recessed portion.

7. The housing of claim 1, further comprising a second fingernail shaped recessed portion having a second recessed portion provided on the third surface between the elongated recessed portion and the first surface.

8. The housing of claim 1, wherein the first riser is corresponding to the first slot.

9. The housing of claim 1, further comprising a plurality of second holes provided on a periphery of the first fingernail shaped raised portion.

10. The housing of claim 1, wherein the second riser is corresponding to the first recessed portion of the elongated recessed portion.

11. The housing of claim 1, further comprising a third fingernail shaped raised portion having a third riser provided the fourth surface.

12. The housing of claim 11, wherein the third riser is corresponding to the second recessed portion of the second fingernail shaped recessed portion.

* * * * *